US012717074B2

(12) United States Patent
Menke et al.

(10) Patent No.: US 12,717,074 B2
(45) Date of Patent: Aug. 25, 2026

(54) DISPLAY AND OPTICAL FILM

(71) Applicant: 3M INNOVATIVE PROPERTIES COMPANY, St. Paul, MN (US)

(72) Inventors: Stephen M. Menke, Eagan, MN (US); Gilles J.B. Benoit, Minneapolis, MN (US); Adam D. Haag, Woodbury, MN (US); Kevin W. Gotrik, Hudson, WI (US); Nicholas C. Erickson, Saint Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 652 days.

(21) Appl. No.: 18/022,943

(22) PCT Filed: Aug. 11, 2021

(86) PCT No.: PCT/IB2021/057407

§ 371 (c)(1),
(2) Date: Feb. 23, 2023

(87) PCT Pub. No.: WO2022/058812

PCT Pub. Date: Mar. 24, 2022

(65) Prior Publication Data

US 2023/0314676 A1 Oct. 5, 2023

Related U.S. Application Data

(60) Provisional application No. 63/078,384, filed on Sep. 15, 2020.

(51) Int. Cl.
*H10K 59/35* (2023.01)
*G02B 5/22* (2006.01)
(Continued)

(52) U.S. Cl.
CPC ............... *G02B 5/223* (2013.01); *G02B 5/26* (2013.01); *H10K 59/35* (2023.02); *H10K 59/878* (2023.02);
(Continued)

(58) Field of Classification Search
CPC ....................................................... G02B 5/26
(Continued)

(56) References Cited

U.S. PATENT DOCUMENTS 5,032,461 A 7/1991 Shaw et al.
5,882,774 A 3/1999 Jonza et al.
(Continued)

FOREIGN PATENT DOCUMENTS

CN 109256455 B 6/2020
JP 11142840 A 5/1999
(Continued)

OTHER PUBLICATIONS

International Search Report for PCT International Application No. PCT/IB2021/057407, mailed on Oct. 12, 2021, 4 pages.

*Primary Examiner* — Christopher M Raabe
(74) *Attorney, Agent, or Firm* — Clifton E. Richardson; Theresa R. Stadheim

(57) ABSTRACT

A display includes a pixelated emission surface including a plurality of blue, green and red light emitting pixels having emission peaks at respective blue, green and red peak wavelengths. The display includes a plurality of blue light emitting sources aligned to the plurality of blue, green and red light emitting pixels in a one-to-one correspondence. An optical film is disposed between the emission surface and the plurality of blue light emitting sources. Each region of the optical film that is disposed between a blue light emitting source and the corresponding blue light emitting pixel transmits at least 70% of substantially normally incident (Continued)

light having the blue peak wavelength. Each region of the optical film that is disposed between a blue light emitting source and the corresponding green or red light emitting pixel reflects at least 50% of substantially normally incident light having the blue peak wavelength.

20 Claims, 9 Drawing Sheets

(51) Int. Cl.
*G02B 5/26* (2006.01)
*H10K 59/80* (2023.01)

(52) U.S. Cl.
CPC ....... *H10K 59/879* (2023.02); *H10K 59/8791* (2023.02)

(58) Field of Classification Search
USPC .................................................. 313/498–512
See application file for complete search history.

(56) References Cited

U.S. PATENT DOCUMENTS

| | | | |
|---|---|---|---|
| 6,179,948 B1 | 1/2001 | Merrill et al. | |
| 6,783,349 B2 | 8/2004 | Neavin et al. | |
| 6,967,778 B1 | 11/2005 | Wheatley et al. | |
| 7,018,713 B2 | 3/2006 | Padiyath et al. | |
| 7,892,382 B2 | 2/2011 | Bellmann et al. | |
| 8,487,329 B2 | 7/2013 | Von Malm | |
| 9,019,607 B2 | 4/2015 | Merrill et al. | |
| 9,162,406 B2 | 10/2015 | Neavin et al. | |
| 10,156,754 B2 | 12/2018 | Saneto et al. | |
| 10,316,245 B2 | 6/2019 | Nelson et al. | |
| 2007/0077525 A1 | 4/2007 | Davis et al. | |
| 2008/0157663 A1* | 7/2008 | Sung | H10K 59/80524 445/24 |
| 2013/0335677 A1 | 12/2013 | You | |
| 2016/0041317 A1 | 2/2016 | Kim et al. | |
| 2017/0068127 A1 | 3/2017 | Lee et al. | |
| 2017/0082892 A1 | 3/2017 | Chung | |
| 2017/0371205 A1 | 12/2017 | Pellerite et al. | |
| 2019/0187517 A1* | 6/2019 | Kwak | G02B 5/287 |
| 2019/0189835 A1* | 6/2019 | Dussaigne | H10H 20/0137 |
| 2019/0331837 A1 | 10/2019 | Wheatley et al. | |

FOREIGN PATENT DOCUMENTS

| | | |
|---|---|---|
| JP | 2002350626 A | 12/2002 |
| JP | 2003066221 A | 3/2003 |
| JP | 2008070437 A | 3/2008 |
| JP | 2008304696 A | 12/2008 |
| KR | 20050013893 A | 2/2005 |
| KR | 20170096583 A | 8/2017 |
| WO | 2009086276 A1 | 7/2009 |
| WO | 2015012260 A1 | 1/2015 |
| WO | 2020175464 A1 | 9/2020 |

* cited by examiner 41
42
88
40r
40g
40b
50
40'''

DISPLAY AND OPTICAL FILM

CROSS REFERENCE TO RELATED APPLICATIONS

This application is a national stage filing under 35 U.S.C. 371 of PCT/IB2021/057407, filed Aug. 11, 2021, which claims the benefit of U.S. Application No. 63/078,384, filed Sep. 15, 2020, the disclosures of which are incorporated by reference in their entirety herein.

BACKGROUND

An organic light emitting diode (OLED) display can include a blue light emitting layer and green and red color conversion materials to produce green and red light from the blue light.

SUMMARY

The present disclosure relates generally to displays and to optical films. An optical film can be patterned to have different reflectivity in different regions of the optical film. A display can include the optical film disposed between an emission surface of the display and a plurality of blue light emitting sources.

In some aspects of the present disclosure, a display is provided. The display includes a pixelated emission surface including a plurality of blue, green and red light emitting pixels configured to display an image at the emission surface and having respective blue, green and red emission spectra including respective blue, green and red emission peaks at respective blue, green and red peak wavelengths. The display includes a plurality of blue light emitting sources aligned to the plurality of blue, green and red light emitting pixels in a one-to-one correspondence. Each blue light emitting source has substantially the blue emission spectrum including the blue emission peak at the blue peak wavelength. The display includes an optical film disposed between, and substantially coextensive with, the emission surface and the plurality of blue light emitting sources and including a plurality of layers numbering at least 10 in total where each layer has an average thickness less than about 500 nm. For substantially normally incident light and for each of mutually orthogonal first and second polarization states: each region of the optical film that is disposed between a blue light emitting source and the corresponding blue light emitting pixel transmits at least 70% of the incident light having the blue peak wavelength; and each region of the optical film that is disposed between a blue light emitting source and the corresponding green or red light emitting pixel transmits at least 70% of the incident light for each of the green and red peak wavelengths, and reflects at least 50% of the incident light having the blue peak wavelength.

In some aspects of the present disclosure, a multilayer continuous optical film including a plurality of layers numbering at least 20 in total where each of the layers has an average thickness of less than about 500 nm is provided. The multilayer continuous optical film includes pluralities of at least alternating first and second regions arranged along rows and columns of the first and second regions and configured to be aligned in one-to-one correspondence to a plurality of pixels of a display. For substantially normally incident light having a wavelength in a desired wavelength range extending from about 400 nm to about 2000 nm and for each of mutually orthogonal first and second polarization states: the first regions of the multilayer continuous optical film transmit at least 70% of the incident light having a first wavelength in the desired wavelength range and reflect at least 70% of the incident light having a second wavelength in the desired wavelength range; and the second regions of the multilayer continuous optical film reflect at least 70% of the incident light having the first wavelength and transmit at least 70% of the incident light having the second wavelength.

In some aspects of the present disclosure, a display including a plurality of blue, green and red light emitting pixels configured to display an image at an emission surface of the display is provided. The blue, green and red light emitting pixels have respective blue, green and red emission spectra including respective blue, green and red emission peaks at respective blue, green and red peak wavelengths. Each light emitting pixel includes a blue light emitting source having substantially the blue emission spectrum including the blue emission peak at the blue peak wavelength; and a multilayer optical film disposed between the emission surface and the blue light emitting source and including a plurality of layers numbering at least 10 in total where each layer has an average thickness less than about 500 nm. For substantially normally incident light and for each of mutually orthogonal first and second polarization states: the plurality of layers in each blue light emitting pixel transmits at least 70% of the incident light having the blue peak wavelength; and the plurality of layers in each of the green and red light emitting pixels reflects at least 70% of the incident light having the blue peak wavelength and transmits at least 70% of the incident light for each of the green and red peak wavelengths.

These and other aspects will be apparent from the following detailed description. In no event, however, should this brief summary be construed to limit the claimable subject matter.

DETAILED DESCRIPTION

In the following description, reference is made to the accompanying drawings that form a part hereof and in which various embodiments are shown by way of illustration. The drawings are not necessarily to scale. It is to be understood that other embodiments are contemplated and may be made without departing from the scope or spirit of the present description. The following detailed description, therefore, is not to be taken in a limiting sense.

Organic light emitting diode (OLED) displays including blue light emitting sources and green and red color conversion materials to produce green and red light from the emitted blue light are known in the art and are described in Korean Pat. Appl. Pub. No. 10-2017-0096583 (Park et al.), for example. Such displays may include blue light emitting sources (blue emissive OLED layers) without including green or red light emitting sources (green or red emissive OLED layers). The display may include a color filter to absorb unconverted blue light transmitted through the green and red color conversion materials. However, absorbing such light lowers the efficiency of the display. An alternative is to include light scattering particles in the light conversion regions that include the green and red color conversion materials. This increases the effective path length of light in the light conversion regions and therefore increases the fraction of blue light that is converted to green or red light. However, including scattering particles can disrupt the polarization of light transmitted through the region. This can have the undesired effect of increasing ambient reflection from the display since the circular polarizer typically included in an OLED display is not as effective in reducing ambient reflection when elements that are not polarization preserving are included between the circular polarizer and reflective elements of the display. According to some embodiments of the present description, a patterned optical film is included between the circular polarizer and a light conversion layer. The optical film can be substantially transmissive to blue light in regions corresponding to blue pixels and substantially reflective to blue light in regions corresponding to red and green pixels so that including the optical film results in recycling of unconverted blue light transmitted through the green and red color conversion materials. This can provide improved blue to green and blue to red color conversion efficiency without sacrificing low ambient reflection.

Figure 1:
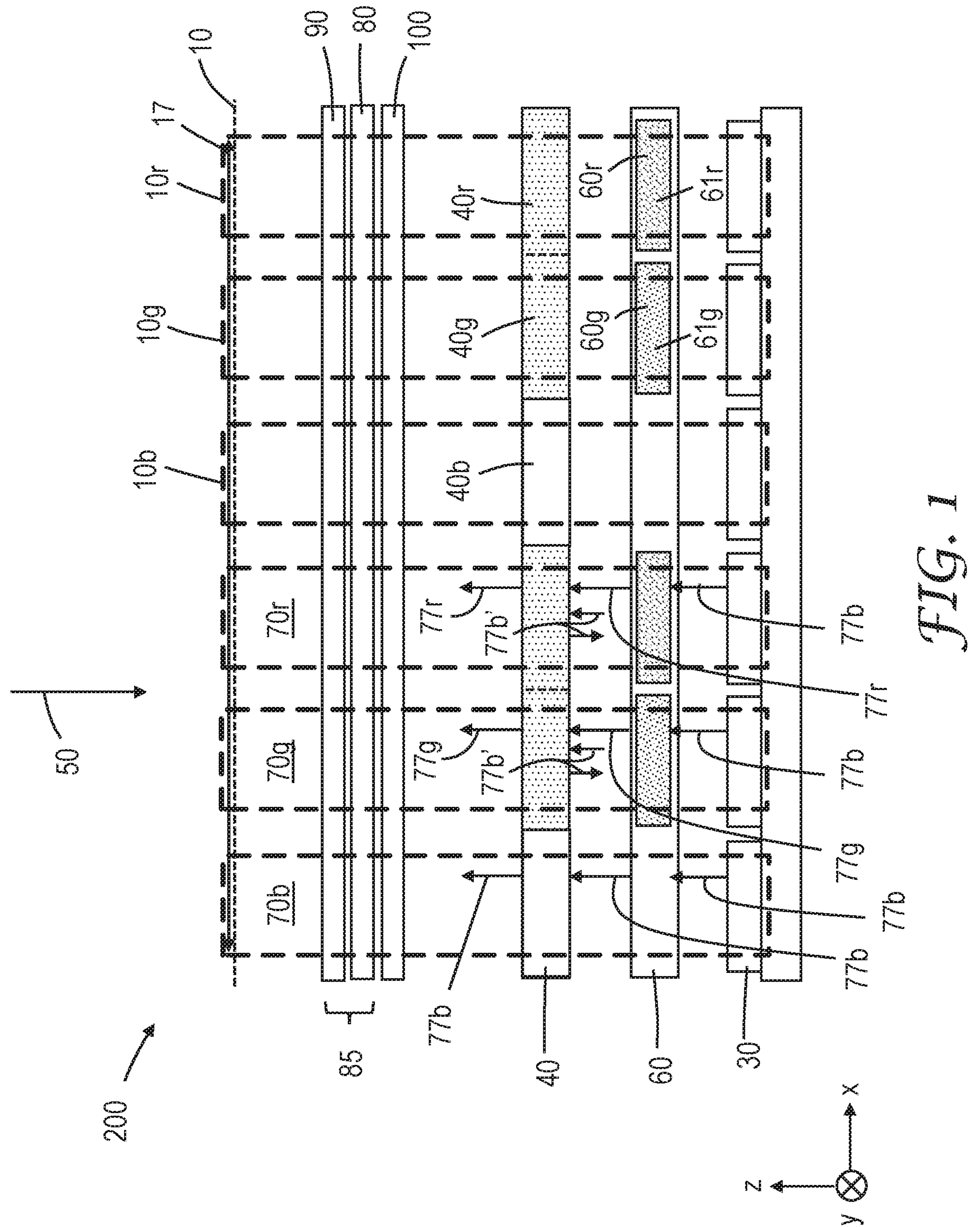
FIG. 1 is a schematic cross-sectional view of an illustrative display.

FIG. 1 is a schematic cross-sectional view of a display 200, according to some embodiments. The display 200 can include a pixelated emission surface 10 including a plurality of blue (10*b*), green (10*g*) and red (10*r*) light emitting pixels configured to display an image 17 at the emission surface 10; a plurality of blue light emitting sources 30 aligned to the plurality of blue, green and red light emitting pixels in a one-to-one correspondence; and an optical film 40 disposed between, and substantially coextensive with, the emission surface and the plurality of blue light emitting sources. The blue light emitting sources 30 can be any blue emissive sources such as OLED or LED (e.g., mini or micro LED, quantum dot LED, or quantum nanorod LED) sources, for example. The optical film 40 may substantially conform to the pixelated emission surface 10 (e.g., the optical film 40 may be disposed substantially in a plane parallel to the pixelated emission surface 10 or the optical film may be curved to generally follow the shape of the pixelated emission surface 10 in the case of a curved display). The display 200 may be described as including a plurality of blue (70*b*), green (70*g*) and red (70*r*) light emitting pixels defining the respective plurality of blue (10*b*), green (10*g*) and red (10*r*) light emitting pixels of the pixelated emission surface 10 where each of the blue (70*b*), green (70*g*) and red (70*r*) light emitting pixels includes a blue light emitting source 30 and corresponding portions of the films or layers between the blue light emitting sources 30 and the pixelated emission surface 10.

Layers or elements can be described as substantially coextensive with each other if at least about 60% by area of each layer or element is coextensive with at least about 60% by area of each other layer or element. In some embodiments, for layers or elements describes as substantially coextensive, at least about 70%, or at least about 80%, or at least about 90% by area of each layer or element is coextensive with at least about 70%, or at least about 80%, or at least about 90% by area of each other layer or element. In the case of a layer of a plurality of discrete elements, the area in this context is the area within an outer boundary of a region defined by the plurality of discrete elements. For example, the area of the plurality of blue light emitting sources 30 can be understood to be the entire area of the pixelated emission surface 10 even when the blue light emitting sources 30 are arranged with gaps between adjacent light emitting sources.

The display 200 can include a light converting film 60 disposed between the optical film and the plurality of blue light emitting sources 30 and including pluralities of green (60*g*) and red (60*r*) light converting regions, such that: each green light converting region 60*g* is disposed between a green light emitting pixel 10*g* and the corresponding blue light emitting source 30 and is configured to convert at least a portion of the blue light 77*b* emitted by the blue light emitting source 30 to a converted green light 77*g* and transmit the converted green light 77*g* toward the green light emitting pixel 10*g* through the optical film 40; and each red light converting region 60*r* is disposed between a red light emitting pixel 10*r* and the corresponding blue light emitting source and is configured to convert at least a portion of the blue light 77*b* emitted by the blue light emitting source 30 to a converted red light 77*r* and transmit the converted red light 77*r* toward the red light emitting pixel 10*r* through the optical film 40. The light converting film 60 may be a self-supporting film or may be a non-self-supporting layer or layers or coating formed on the blue light emitting sources 30, for example. The light converting film 60 may be printed, coated, deposited, or patterned via lithography, for example. The light converting film 60 may be configured to transmit blue light 77*b* emitted by the blue light emitting source 30 corresponding to a blue light emitting pixel 10*b* without wavelength conversion. Regions 40*b* of the optical film 40 that are disposed between a blue light emitting source 30 and the corresponding blue light emitting pixel 10*b* may substantially transmit the blue light 77*b*. Regions 40*g*, 40*r* of the optical film 40 that are disposed between a blue light emitting source 30 and the corresponding green or red light emitting pixel 10*g* or 10*r* may substantially transmit the converted green or red light 77*g* or 77*r* while substantially reflecting an unconverted portion 77*b*' of the blue light 77*b*.

The light converting film 60 can include light converting elements 61*g*, 61*r* in the respective light converting regions 60*g*, 60*r*. The light converting elements 61*g*, 61*r* can be phosphor, fluorescent dye, or quantum dots, for example. In some embodiments, the light converting film 60 includes one or more of phosphor, fluorescent dye, and quantum dots. Suitable down-converting materials for the light converting film are known in the art and include those described in U.S. Pat. No. 10,316,245 (Nelson et al.), U.S. Pat. No. 10,156,754 (Saneto et al.), and U.S. Pat. No. 7,892,382 (Bellmann et al.); in U.S. Pat. Appl. Pub. Nos. 2013/0335677 (You) and 2017/0371205 (Pellerite et al.); and in references provided therein, for example. In some embodiments, the light converting film 60 is vapor deposited. Suitable methods of vapor depositing a light converting film are known in the art and include those described in U.S. Pat. No. 8,487,329 (Von Malm), for example.

The display 200 can further include one or more of an absorbing polarizer 90, a retarder layer 80, an optical filter 100 (e.g., a neutral density filter) disposed between, and substantially coextensive with, the pixelated emission surface 10 and the optical film 40. As is known in the art, an OLED display typically includes a circular polarizer to reduce ambient reflection. Similarly, a circular polarizer may be included in other types of displays (e.g., micro LED displays) to reduce ambient reflection. A circular polarizer 85 can be formed from an absorbing polarizer 90 and a retarder layer 80. A neutral density filter can optionally be included to further reduce ambient reflection. In some embodiments, the ambient reflection is suitably low without a neutral density filter. Accordingly, in some embodiments, the optical filter 100 is omitted.

Figure 2A:
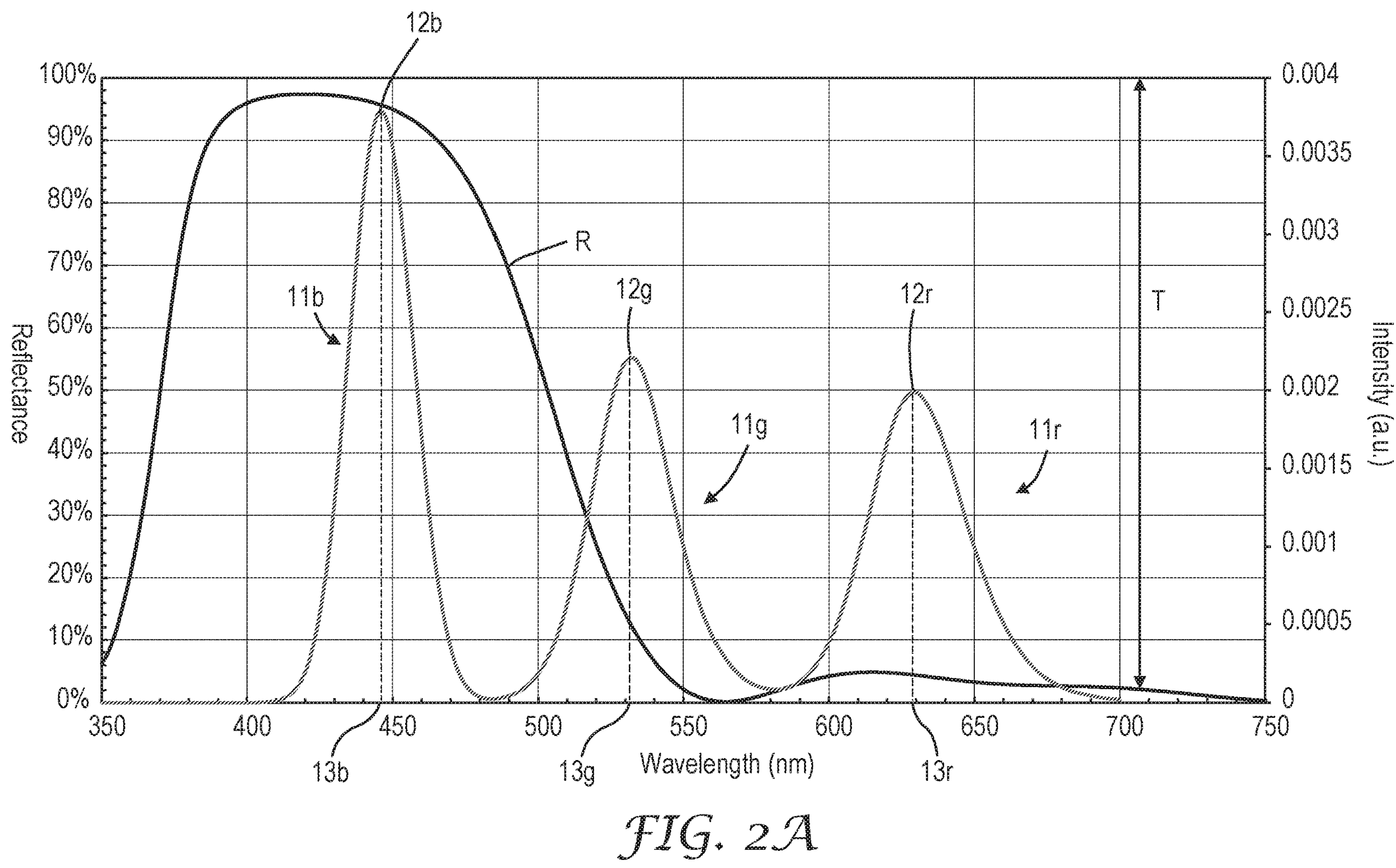
FIGS. 2A-2B are schematic plots of illustrative blue, green and red emission spectra and of optical reflectance of portions of exemplary optical films.
Figure 2B:
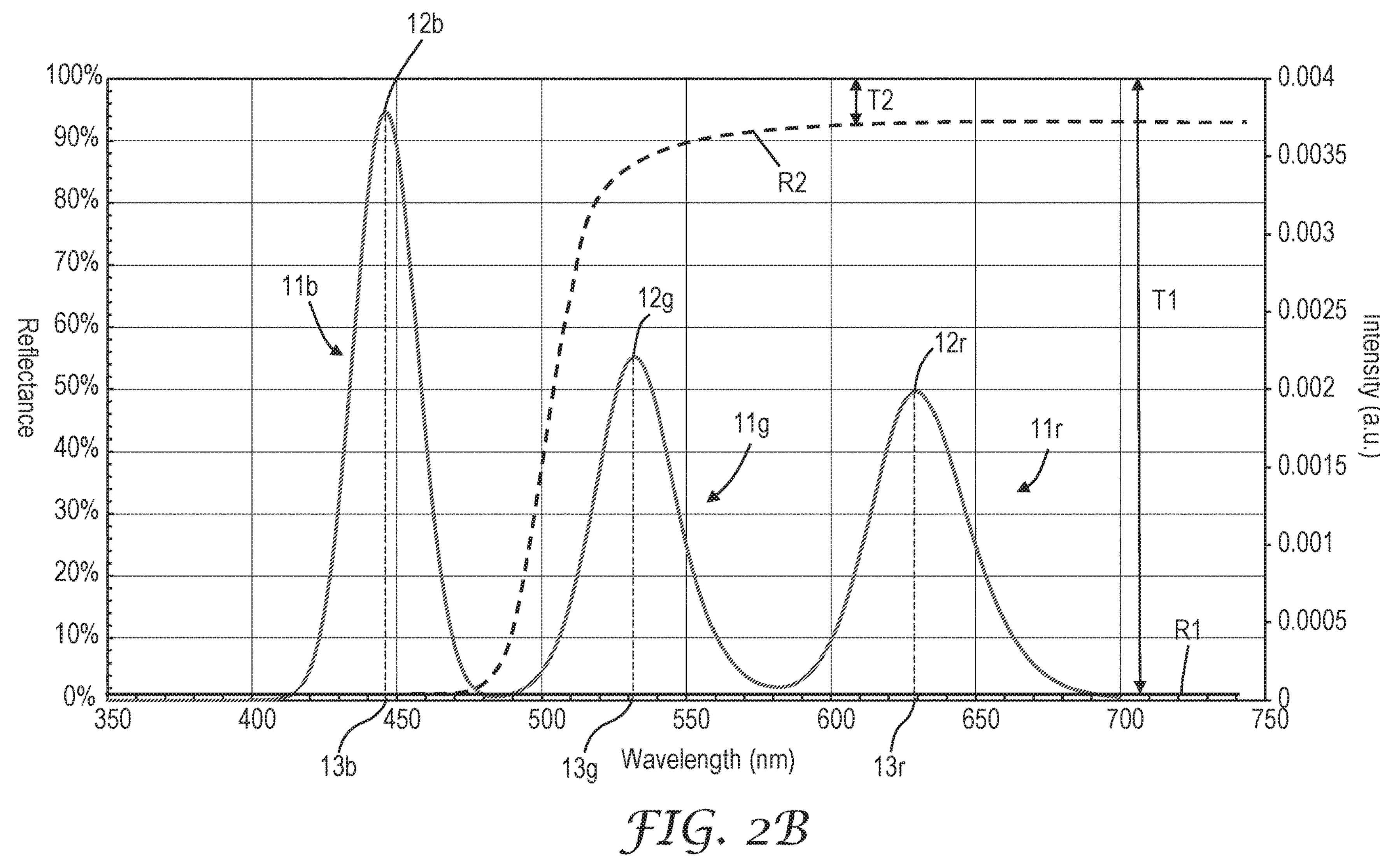

FIGS. 2A-2B are schematic plots of blue, green and red emission spectra and of optical reflectance of portions of optical films, according to some embodiments. The plurality of blue (10*b*), green (10*g*) and red (10*r*) light emitting pixels have respective blue (11*b*), green (11*g*) and red (11*r*) emission spectra including respective blue (12*b*), green (12*g*) and red (12*r*) emission peaks at respective blue (13*b*), green (13*g*) and red (13*r*) peak wavelengths. The optical reflectance R and corresponding optical transmittance T of FIG. 2A can be the reflectance and corresponding transmittance for a portion of the optical film disposed between a blue light emitting source 30 and the corresponding blue light emitting pixel 10*b*. The optical reflectance R1 and corresponding optical transmittance T1 of FIG. 2B can be the reflectance and corresponding transmittance for a portion of the optical film disposed between a blue light emitting source 30 and the corresponding green (10*g*) or red (10*r*) light emitting pixel. In other embodiments, the optical reflectance R2 and corresponding optical transmittance T2 of FIG. 2B can be the reflectance and corresponding transmittance for a portion of the optical film disposed between a blue light emitting source 30 and the corresponding green (10*g*) or red (10*r*) light emitting pixel. The optical transmittance in these examples is taken to be 100% minus the optical reflectance (i.e., any optical absorption is taken to be negligible). As described further elsewhere, the optical film 40 can include a plurality of layers configured to provide the desired reflection spectra where at least some of the layers have different thicknesses or optical properties in the blue light emitting pixels than in the red or green light emitting pixels.

In some embodiments, for substantially normally incident (e.g., within 30 degrees, or 20 degrees, or 10 degrees of normally incident or nominally normally incident) light 50 and for each of mutually orthogonal first (e.g., polarized along x-axis) and second (e.g., polarized along y-axis) polarization states: each region 40*b* of the optical film 40 that is disposed between a blue light emitting source 30 and the corresponding blue light emitting pixel 10*b* transmits (see, e.g., optical transmittance T1 or T2 in FIG. 2B) at least 70% of the incident light 50 having the blue peak wavelength 13*b*; and each region 40*g*, 40*r* of the optical film that is disposed between a blue light emitting source 30 and the corresponding green (10*g*) or red (10*r*) light emitting pixel transmits (see, e.g., optical transmittance Tin FIG. 2A) at least 70% of the incident light 50 for each of the green (13*g*) and red (13*r*) peak wavelengths, and reflects (see, e.g., optical reflectance R ion FIG. 2A) at least 50% of the incident light having the blue peak wavelength 13*b*. In some embodiments, the blue peak wavelength 13*b* is between about 420 nm and about 460 nm, the green peak wavelength 13*g* is between about 510 nm and about 560 nm, and the red peak wavelength 13*r* is between about 610 nm and about 670 nm. In some embodiments, the optical film, or the plurality of layers of the optical film, in each blue light emitting pixel 70*b* reflects (see, e.g., R2 in FIG. 2B) at least 60%, or at least 70%, or at least 80% of the incident light for each of the green (13*g*) and red (13*r*) peak wavelengths. In some embodiments, the optical film is configured to reflect green and red light in the blue light emitting pixels 70*b* to reduce pixel blurring, for example, that might otherwise occur due to red or green light reflecting from the optical film in a red or green pixel and then reflecting from the layer of blue light emitting sources 30 or from other layers in the display towards a blue pixel. Alternatively, or in addition, the optical film can include more optical layers to define a sharper right band edge to the reflection R depicted in FIG. 2A resulting in reduced reflection at green and red wavelengths.

In some embodiments, for substantially normally incident light 50, for each of mutually orthogonal first (e.g., polarized along x-axis) and second (e.g., polarized along y-axis) polarization states, and for each region 40*b* of the optical film that is disposed between a blue light emitting source 30 and the corresponding blue light emitting pixel 10*b*, the region 40*b*, or the plurality of layers of the optical film 40 in the region 40*b*, transmits at least 75%, or 80%, or 85%, or 90%, or 95%, or 99%, or 99.9% of the incident light having the blue peak wavelength. In some such embodiments, or in other embodiments, for substantially normally incident light 50, for each of mutually orthogonal first (e.g., x-axis) and second (e.g., y-axis) polarization states, and for each region (40*g*, 40*r*) of the optical film that is disposed between a blue light emitting source 30 and the corresponding green (10*g*) or red (10*r*) light emitting pixel, the region, or the plurality of layers of the optical film 40 in the region, transmits at least 75%, or at least 80%, or at least 85% of the incident light for each of the green and red peak wavelengths. In some such embodiments, or in other embodiments, for substantially normally incident light 50, for each of mutually orthogonal first (e.g., x-axis) and second (e.g., y-axis) polarization states, and for each region (40*g*, 40*r*) of the optical film 40 that is disposed between a blue light emitting source 30 and the corresponding green (10*g*) or red (10*r*) light emitting pixel, the region, or the plurality of layers of the optical film in the region, reflects at least 60% or at least 70% or at least 80%, or at least 85% of the incident light having the blue peak wavelength. For example, in some embodiments, for substantially normally incident light and for each of the first and second polarization states: for each region of the optical film that is disposed between a blue light emitting source and the corresponding blue light emitting pixel, the plurality of layers transmits at least 80% of the incident light having the blue peak wavelength; and for each region of the optical film that is disposed between a blue light emitting source and the corresponding green or red light emitting pixel, the plurality of layers transmits at least 80% of the incident light for each of the green and red peak wavelengths, and reflects at least 80% of the incident light having the blue peak wavelength. In some embodiments, the optical film 40 includes through openings in regions 40*b* of the optical film 40 corresponding to the blue light emitting pixels 10*b*, for example. Such through openings can provide a high transmission of light incident on the optical film in the regions 40*b*.

In some embodiments, each blue light emitting source 30 has substantially the blue emission spectrum 11*b* including the blue emission peak 12*b* at the blue peak wavelength 13*b*. In some embodiments, there may be substantially no down-converting or color shifting elements between the blue light emitting source 30 and the blue light emitting pixels 10*b* so that the emission spectrum of each blue light emitting source 30 can be the same or about the same as the emission spectrum 11*b* of the blue light emitting pixels 10*b*. As used herein, emission spectra can be considered to be the same if they are the same up to overall normalization so that inclusion of a neutral density filter or other neutral absorptive element (e.g., a circular polarizer) is considered to not change the emission spectra. Different emission spectra can be considered to be substantially the same when the spectra have the same general shape on a plot of intensity versus wavelength and have a peak at about the same peak wavelength.

Figure 3:
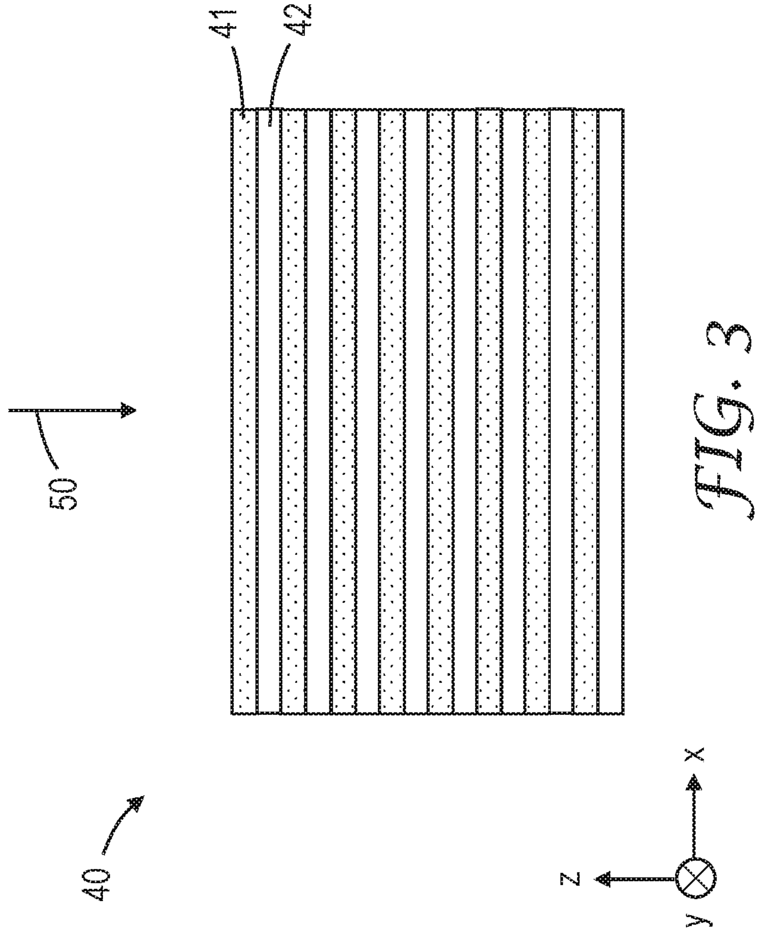
FIG. 3 is a schematic cross-sectional view of an illustrative optical film.
Figure 4A:
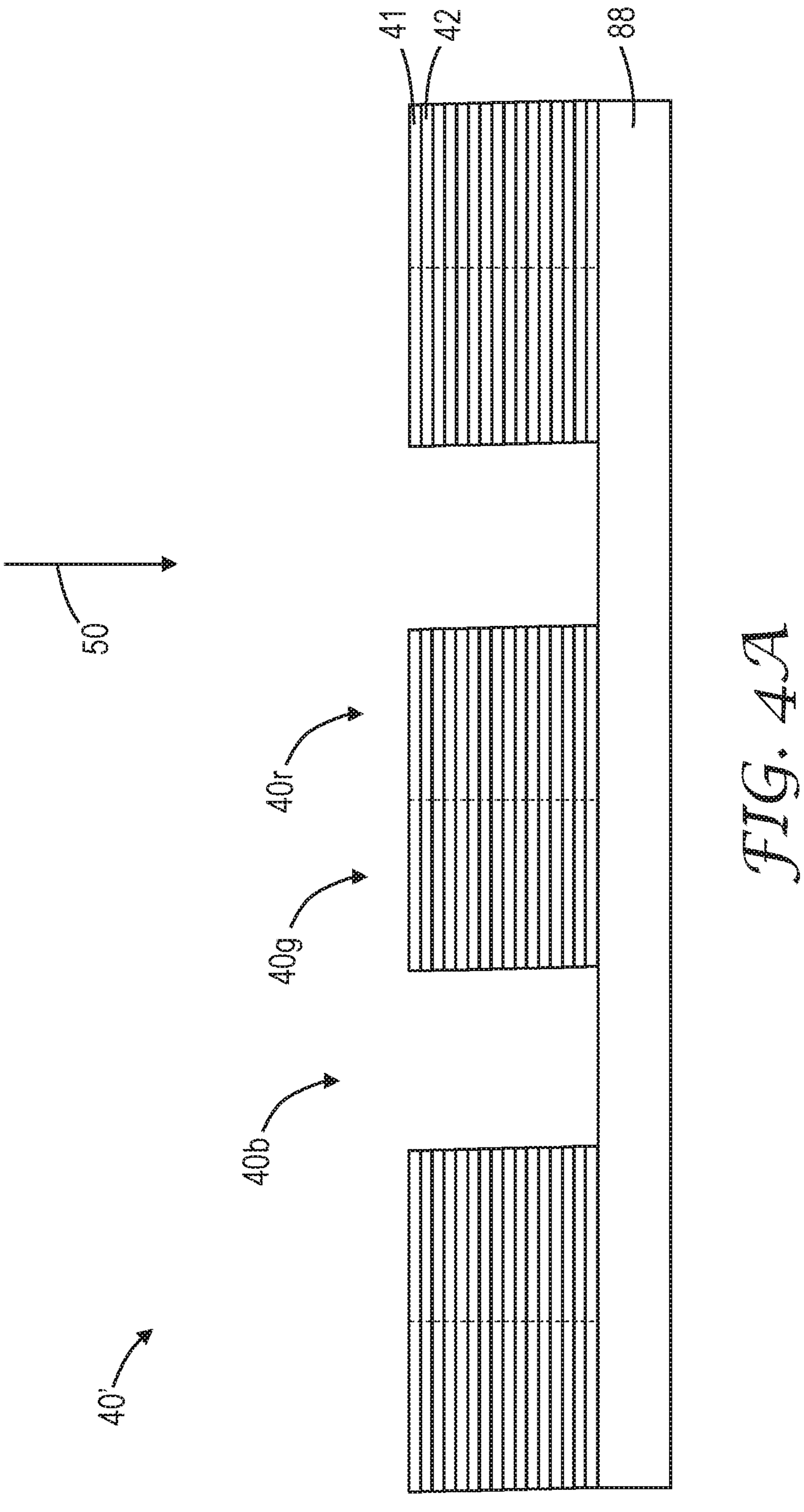
FIGS. 4A-4D are schematic cross-sectional views of illustrative patterned optical films.
Figure 4B:
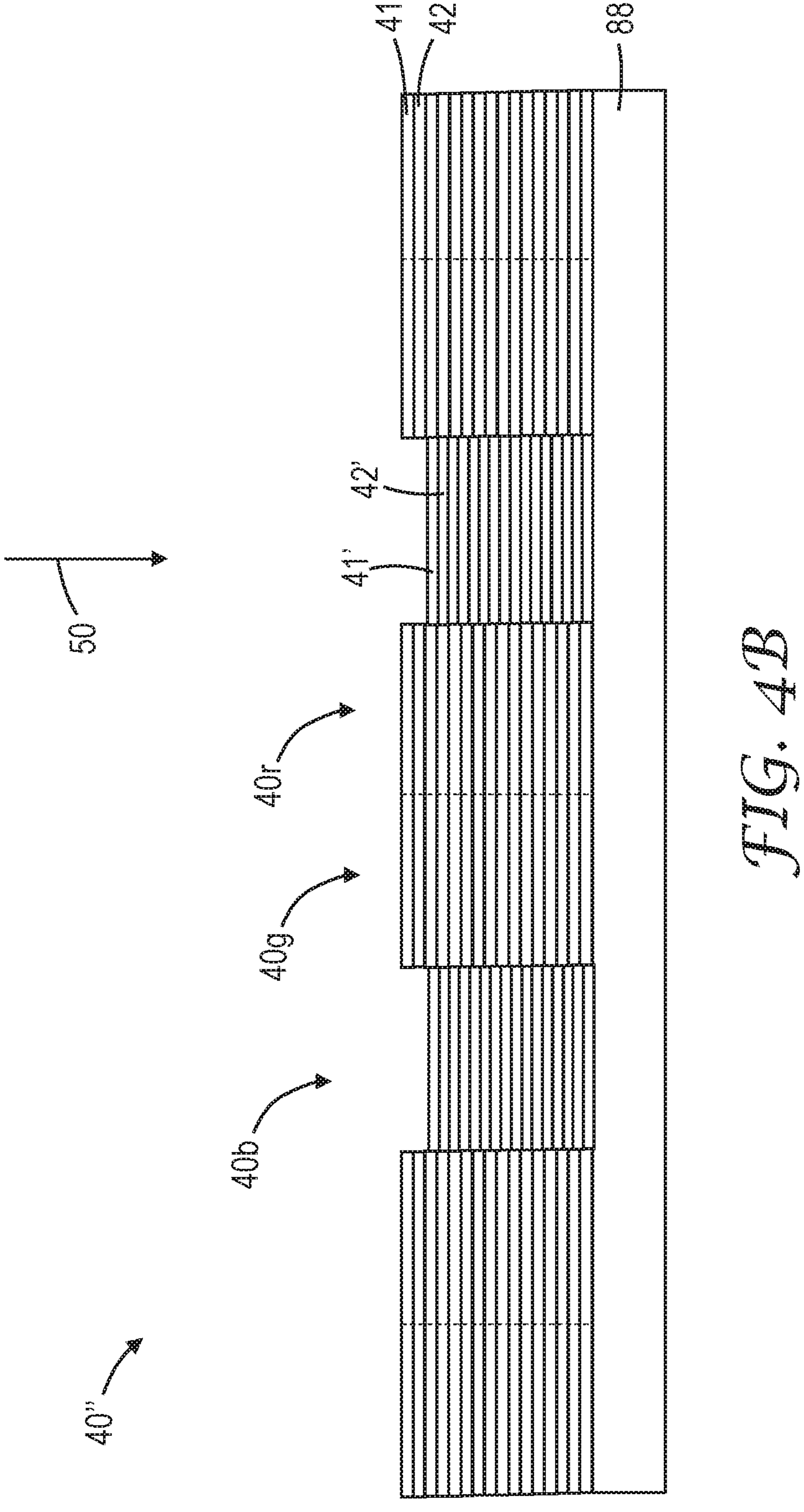
Figure 4C:
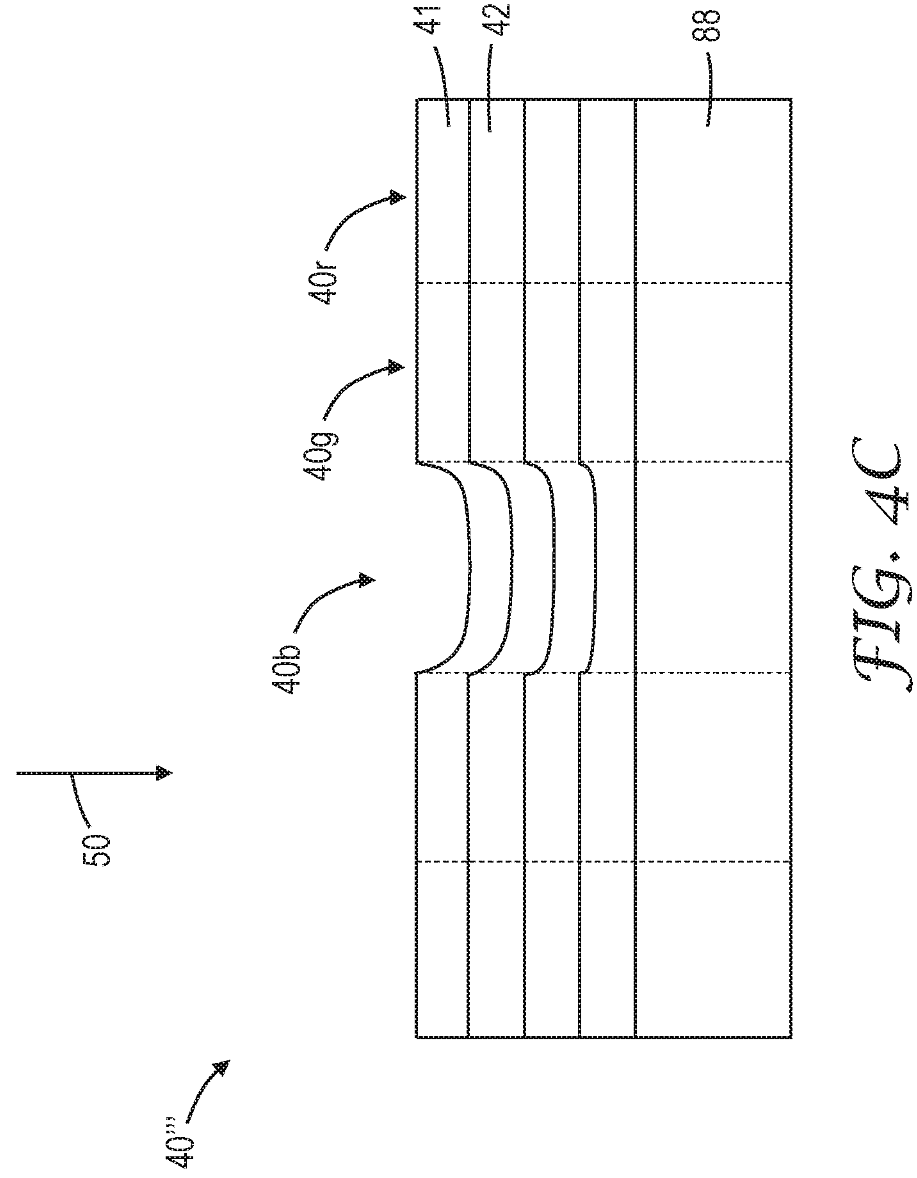
Figure 4D:
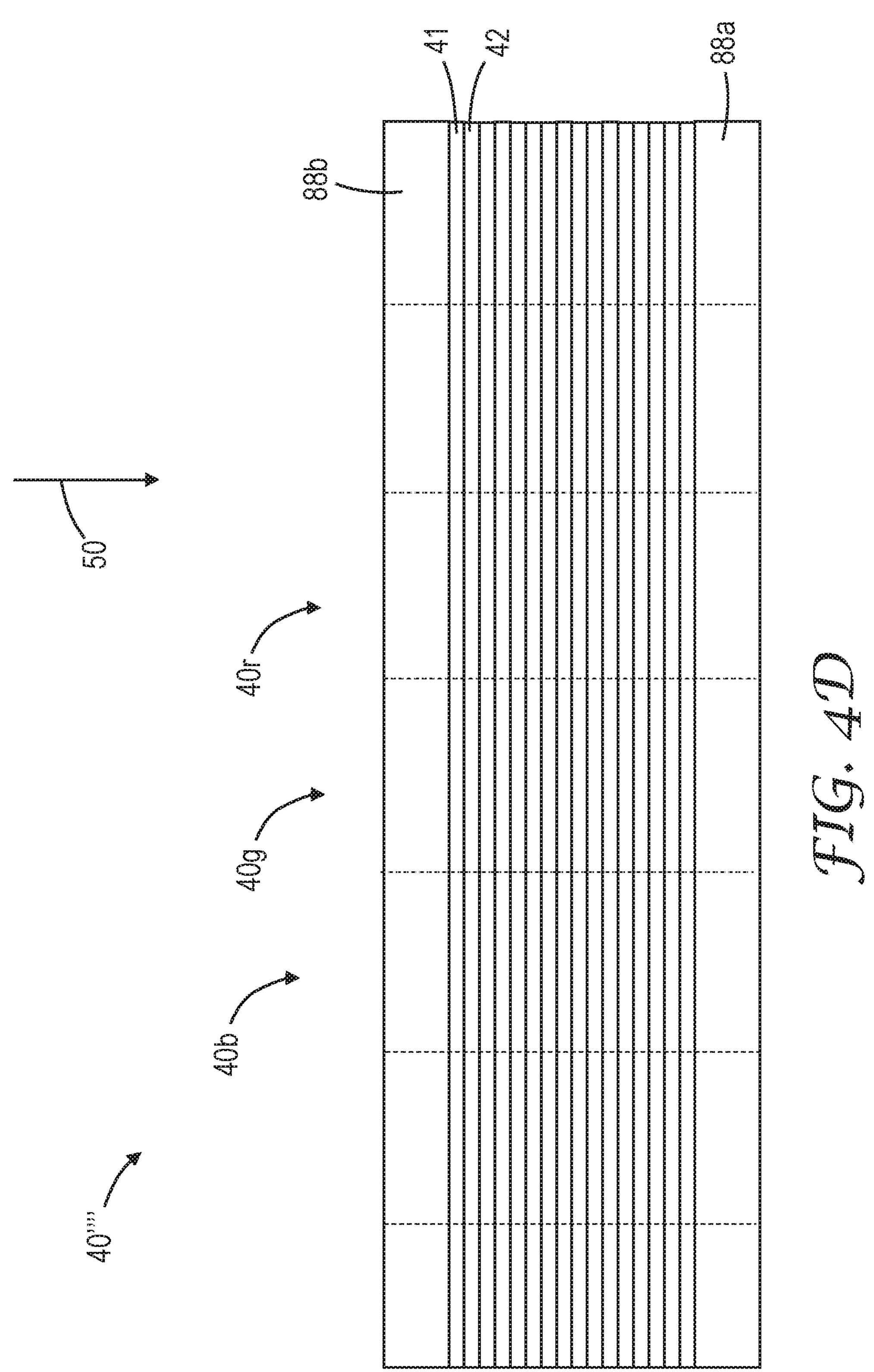

FIG. 3 is a schematic cross-sectional view of an optical film 40 including a plurality of layers 41 and 42, according to some embodiments. The number of layers may be different from that schematically shown in FIG. 3 (and similarly for other figures). The plurality of layers 41, 42 can number at least 10 in total, or at least 20 in total, where each layer 41, 42 can have an average thickness less than about 500 nm, or less than about 300 nm, or less than about 200 nm, or less than about 150 nm. Each layer 41, 42 can have an average thickness greater than about 10 nm, or greater than about 20 nm, for example. In some embodiments, the plurality of layers 41, 42 number no more than 500, or 300, or 200 in total. The thickness of the layers and the number of layers can be selected to provide a desired reflection band, as is known in the art (see, e.g., U.S. Pat. No. 6,967,778). A smaller number of layers 41,42 may be used when a refractive index difference between the layers is larger, for example. The optical film 40 may optionally include other layers (e.g., the substrate 88 depicted in FIGS. 4A-4C or the skin layers 88*a* and 88*b* depicted in FIG. 4D) having an average thickness greater than about 1 micrometer, or greater than 2 micrometers, for example. In some embodiments, the optical film 40 is a multilayer continuous optical film which may be patterned as described further elsewhere to include different regions having different reflective properties. An optical film including a plurality of layers is continuous when for each layer in the plurality of layers, or for each layer in at least a majority of the layers, there are continuous paths in the layer across a length and a width of the film where the length and the width are along orthogonal directions (e.g., x- and y-directions) that are each orthogonal to a thickness direction (e.g., z-direction) of the film. In some embodiments, a continuous optical film can include discrete spaced apart through holes in at least some of the layers of the film where the through holes do not prevent continuous paths from being defined across the length and width of the film. In other embodiments, no through holes are included. In some embodiments, at least one layer of the film, or at least a majority of the layers, or each layer of the film, can be continuous in each cross-section of the film parallel to a thickness direction of the film. In some embodiments, the optical film 40 is a discontinuous optical film. For example, for some pixel arrangements, the regions 40*b* may be through openings in the optical film that are continuous across a width, for example, of the optical film, according to some embodiments. In such embodiments, the optical film is discontinuous since there are no continuous paths in any layer across the length of the film.

In some embodiments, the layers in the plurality of layers 41, 42 of the multilayer optical film 40 include a polymeric material (e.g., each layer can include a continuous phase of polymeric material). In some embodiments, the layers, or at least some of the layers, in the plurality of layers 41, 42 are polymeric. Polymeric material can be understood to be organic polymeric material, unless indicated differently. In some embodiments, the layers, or at least some of the layers, in the plurality of layers 41, 42 are inorganic (e.g., metal oxide). For example, in some embodiments, the first layers 41 are or include titanium oxide ($TiO_2$) and the second layers are or include silicon dioxide ($SiO_2$). In some embodiments, the plurality of layers includes alternating polymeric and inorganic layers (e.g., layers 41 can be inorganic and layers 42 can be polymeric). For example, the first layers 41 may include a metal oxide and the second layers 42 may include a polymeric material. In some embodiments, the first layers 41 can be or include niobium oxide (NbOx) or titanium oxide ($TiO_2$) or an alloy thereof, and the second layers can be or include an acrylate. Other useful metal oxide materials that can be used for the first layers include silicon oxide, silicon aluminum oxide, aluminum oxide, indium tin oxide, zirconium oxide, silicon nitride, silicon oxynitride, silicon aluminum oxynitride, and alloys thereof. Any metal oxide, for example, that is substantially transparent in a visible wavelength range may be used for the first layers.

In some embodiments, the plurality of layers 41, 42 of the multilayer optical film 40, or of the multilayer optical film 40*g*, 40*r* in the green and red light emitting pixels 70*g*, 70*r*, includes alternating first (41) and second (42) layers stacked along a thickness direction (e.g., z-axis) of the multilayer optical film 40, such that for at least one of the blue, green and red peak wavelengths, a first index of refraction of the first layers is greater than a second index of refraction of the second layers. The first and second indices can be along a same direction (e.g., a same in-plane direction such as the x- or y-direction). In some embodiments, for the at least one of the blue, green and red peak wavelengths, the first index of refraction of the first layers 41 is greater than the second index of refraction of the second layers 42 by at least about 0.2, or at least about 0.3, or at least about 0.4, or at least about 0.5, or at least about 0.6, or at least about 0.7, or at least about 0.8. For example, in some embodiments, the first layers 41 are NbOx layers having a refractive index of about 2.3 or $TiO_2$ layers having a refractive index of about 2.3 to about 2.6 and the second layers 42 are acrylate layers having a refractive index of about 1.5.

In some embodiments, the layers in the plurality of layers are vapor deposited or deposited using other thin-film deposition techniques known in the art. Vapor deposition methods for polymeric and/or inorganic layers are known in the art and are described in U.S. Pat. No. 5,032,461 (Shaw et al.) and U.S. Pat. No. 7,018,713 (Padiyath et al.), for example. The layers can be vapor deposited directly on color conversion layer 60, for example, or can be deposited onto a substrate 88 that is later incorporated into the display 200, for example. Vapor deposited layers can have a low birefringence and/or a low retardance. Low birefringence and/or low retardance may be desired for low reflection of ambient light at oblique angles of incidence since higher birefringence and/or retardance can result in undesired polarization shift of obliquely incident light reflected from the optical film making the circular polarizer less effective in reducing ambient reflection. In other embodiments, the layers in the plurality of layers are formed by extruding and orienting polymeric layers resulting in at least some of the layers (e.g., first layers 41) being birefringent, as generally described in U.S. Pat. No. 5,882,774 (Jonza et al.); U.S. Pat. No. 6,179,948 (Merrill et al.); U.S. Pat. No. 6,783,349 (Neavin et al.); U.S. Pat. No. 6,967,778 (Wheatley et al.); and U.S. Pat. No. 9,162,406 (Neavin et al.), for example.

FIGS. 4A-4D are schematic cross-sectional views of patterned optical films 40', 40", 40'" and 40"", according to some embodiments. Optical film 40 may correspond to any of optical films 40', 40", 40'" or 40"". The optical films 40', 40", 40'" or 40"" may include alternating layers 41, 42 and the substrate 88 or the skin layers 88*a*, 88*b*; or may be considered to be the alternating layers 41, 42 where the optical film is disposed on the substrate 88 or between the skin layers 88*a*, 88*b*. Vapor deposited multilayer optical films can be patterned by depositing the layers of the film through a mask so that regions (e.g., corresponding to blue pixels) of the film do not include the layers (e.g., a through hole can be present). For example, optical film 40' does not include layers 41, 42 in regions 40*b*. Alternatively, the optical film can include a different set of layers (e.g., adapted to reflect in green and red wavelengths, but not blue wavelengths) applied in a separate vapor deposition step through a different mask the blocks other regions (e.g., corresponding to green and red pixels). For example, optical film 40" includes layers 41', 42' in regions 40*b* different than the layers 41, 42 in regions 40*g*, 40*r*. In some embodiments, the layers are deposited uniformly throughout the film where the first (41) and/or second (42) layers are initially partially crosslinked polymeric layers and where the film provides a blue reflection band. The film can then be exposed to ultraviolet (UV) radiation through a mask so that only the regions corresponding to the blue pixels are exposed to the UV radiation. This can result in further crosslinking and shrinkage of the layers in the irradiated region. For example, optical film 40''' schematically illustrated in FIG. 4C includes layers in regions 40*b* that have shrunk relative to the layers in regions 40*g*, 40*r*. In some embodiments, the layers 41, 42 include alternating polymeric and inorganic layers and only the polymeric layers shrink. The shrinkage can result in a shift of the blue reflection band into the UV range. In some embodiments, the blue reflection band is a harmonic of a first order band in a near infrared range such that the shift of the blue reflection band to the UV range also results in a shift of the first order band into the red and/or green wavelength range (e.g., to provide the reflection R2 of FIG. 2B).

Multilayer optical films including birefringent layers can be patterned to reduce reflectivity in some regions (e.g., corresponding to blue pixels) by locally heating the film (e.g., using an infrared laser) to remove or substantially reduce the birefringence of the previously birefringent layers in those regions. Infrared absorptive dyes can be included in the birefringent layers to increase absorption of infrared laser light. Such patterning techniques are described in U.S. Pat. No. 9,019,607 (Merrill et al.), for example. The optical film 40"" of FIG. 4D may be patterned in this way.

Each different region (e.g., regions corresponding to pixels in a display) of a multilayer optical film may be referred to as a multilayer optical film in the region. In some embodiments, the display 200 includes a plurality of blue (70*b*), green (70*g*) and red (70*r*) light emitting pixels configured to display an image 17 at an emission surface 10 of the display 200 and having respective blue (11*b*), green (11*g*) and red (11*r*) emission spectra including respective blue (12*b*), green (12*g*) and red (12*r*) emission peaks at respective blue (13*b*), green (13*g*) and red (13*r*) peak wavelengths. Each light emitting pixel can include a blue light emitting source 30 having substantially the blue emission spectrum 11*b* including the blue emission peak 12*b* at the blue peak wavelength 13*b*; and a multilayer optical film 40*b*, 40*g*, 40*r* disposed between the emission surface and the blue light emitting source 30 and including a plurality of layers 41, 42 numbering at least 10 in total, each layer having an average thickness less than about 500 nm, such that for substantially normally incident light 50 and for each of mutually orthogonal first (e.g., x-axis) and second (e.g., y-axis) polarization states: the plurality of layers 41, 42 in each blue light emitting pixel transmits at least 70% of the incident light 50 having the blue peak wavelength 13*b*; and the plurality of layers 41, 42 in each of the green (70*g*) and red (70*r*) light emitting pixels reflects at least 70% of the incident light 50 having the blue peak wavelength 13*b* and transmits at least 70% of the incident light for each of the green (13*g*) and red (13*r*) peak wavelengths. The multilayer optical films 40*b*, 40*g*, 40*r* in the plurality of light emitting pixels 70*b*, 70*g*, 70*r* may form a continuous optical film 40. In some embodiments the plurality of layers 41, 42 in each blue light emitting pixel 70*b* reflects at least 60% of the incident light 50 for each of the green (13*g*) and red (13*r*) peak wavelengths. The transmission and reflection from optical films 40*b*, 40*g*, 40*r* can be in any of the ranges described elsewhere.

In some embodiments, each light emitting pixel 70*b*, 70*g*, 70*r* further includes an absorbing polarizer 90. In some embodiments, each light emitting pixel 70*b*, 70*g*, 70*r* further includes a retarder layer 80. The retarder layer 80 can be a quarter wave retarder for at least one wavelength in a range of about 400 nm to about 700 nm. In some embodiments, each light emitting pixel 70*b*, 70*g*, 70*r* further includes a circular polarizer 85 (e.g., the absorbing polarizer 90 and the retarder 80 can define the circular polarizer 85). In some embodiments, each light emitting pixel 70*b*, 70*g*, 70*r* further includes a neutral density filter 100. In other embodiments, the neutral density filter 100 is omitted.

Figure 5:
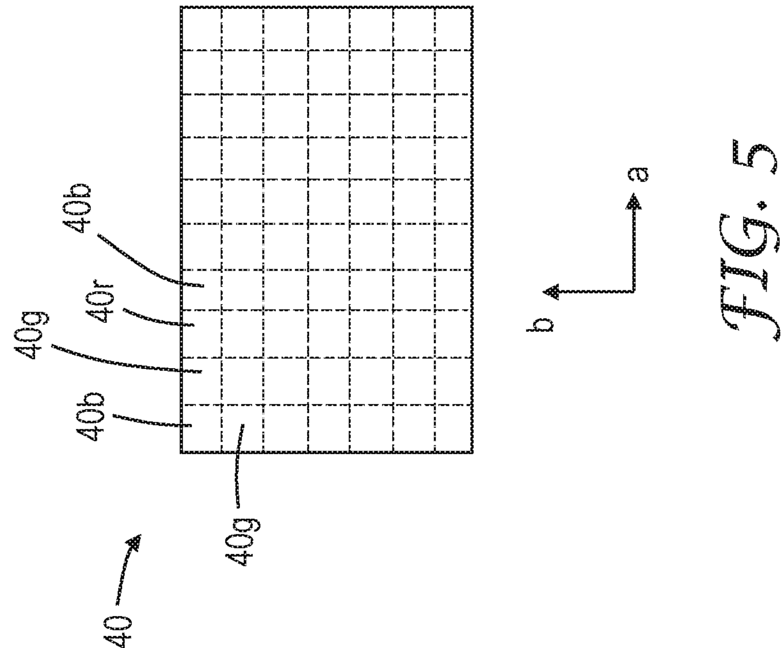
FIG. 5 is a schematic top view of an optical film.

FIG. 5 is a schematic top view of an optical film 40, according to some embodiments. The optical film 40 can be patterned. For example, the optical film 40 can include pluralities of at least alternating first (e.g., 40*b*) and second (e.g., 40*g*) regions where the first and second regions can have different reflection properties. The first and second regions can alternate along one direction or along two different (e.g., orthogonal) directions. For example, the first and second regions can alternate along rows of the first and second regions and/or along columns of the first and second regions.

In some embodiments, a multilayer continuous optical film 40 includes a plurality of layers 41, 42 numbering at least 20 in total where each of the layers have an average thickness of less than about 500 nm. The multilayer continuous optical film 40 includes pluralities of at least alternating first (40*b*) and second (40*g*) regions arranged along rows (a-axis) and columns (b-axis) of the first and second regions and configured to be aligned in one-to-one correspondence to a plurality of pixels (e.g., 70*b* and 70*g*) of a display 200, such that for substantially normally incident light 50 having a wavelength in a desired wavelength range extending from about 400 nm to about 2000 nm, or from about 400 nm to about 700 nm, and for each of mutually orthogonal first (e.g., polarized along the x-axis) and second (e.g., polarized along the y-axis) polarization states: the first regions 40*b* of the multilayer continuous optical film 40 transmit at least 70% of the incident light 50 having a first wavelength (e.g., 13*b*) in the desired wavelength range, and reflect at least 70% of the incident light 50 having a second wavelength (e.g., 13*g* or 13*r*) in the desired wavelength range; and the second regions 40*g* of the multilayer continuous optical film reflect at least 70% of the incident light having the first wavelength, and transmit at least 70% of the incident light having the second wavelength. The pattern of the first (40*b*) and second (40*g*) and optionally third (40*r*) regions can be selected to correspond to the pattern of pixels in a display. The third regions 40*r* may have the same reflection and transmission as the second regions 40*g*. As described further elsewhere, a display 200 can include a pixelated emission surface 10, a plurality of blue light emitting sources 20, and the multilayer continuous optical film 40 disposed between, and substantially coextensive with, the emission surface 10 and the plurality of blue light emitting sources 30. The transmission and reflection from the regions of the optical film can be in any of the ranges described elsewhere.

As described further elsewhere, in some embodiments, layers having low birefringence and/or low retardance may be desired. In some embodiments, a maximum birefringence of each layer in the plurality of layers 41, 42 is less than about 0.01 for at least one of the blue, green and red peak wavelengths or for at least one of the first and second wavelengths. The maximum birefringence is the maximum difference in refractive index in two different directions. In some embodiments, each layer in the plurality of layers has indices of refraction nx and ny along mutually orthogonal in-plane respective x- and y-directions and an index of refraction nz along a thickness direction of the layer orthogonal to the x- and y-directions, where a magnitude of a maximum difference between nx, ny and nz is less than about 0.01 for at least one of the blue, green and red peak wavelengths or for at least one of the first and second wavelengths. In some embodiments, for substantially normally incident light 50, a maximum retardance of the plurality of layers is less than about 10 nm, or less than about 5 nm, or less than about 3 nm, or less than about 1 nm for at least one of the blue, green and red peak wavelengths or for at least one of the first and second wavelengths. The maximum retardance of a layer for normally incident light is the maximum difference in in-plane refractive indices of the layer multiplied by the thickness of the layer. A difference in refractive indices between the first layers 41 and the second layers 42 for at least one of the first and second wavelengths can be in any range described elsewhere herein for at least one of the blue, green and red peak wavelengths.

Terms such as "about" will be understood in the context in which they are used and described in the present description by one of ordinary skill in the art. If the use of "about" as applied to quantities expressing feature sizes, amounts, and physical properties is not otherwise clear to one of ordinary skill in the art in the context in which it is used and described in the present description, "about" will be understood to mean within 10 percent of the specified value. A quantity given as about a specified value can be precisely the specified value. For example, if it is not otherwise clear to one of ordinary skill in the art in the context in which it is used and described in the present description, a quantity having a value of about 1, means that the quantity has a value between 0.9 and 1.1, and that the value could be 1.

All references, patents, and patent applications referenced in the foregoing are hereby incorporated herein by reference in their entirety in a consistent manner. In the event of inconsistencies or contradictions between portions of the incorporated references and this application, the information in the preceding description shall control.

Descriptions for elements in figures should be understood to apply equally to corresponding elements in other figures, unless indicated otherwise. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations, or variations, or combinations of the specific embodiments discussed herein. Therefore, it is intended that this disclosure be limited only by the claims and the equivalents thereof.

What is claimed is:

1. A display comprising:

a pixelated emission surface comprising a plurality of blue, green and red light emitting pixels configured to display an image at the emission surface and having respective blue, green and red emission spectra comprising respective blue, green and red emission peaks at respective blue, green and red peak wavelengths;

a plurality of blue light emitting sources aligned to the plurality of blue, green and red light emitting pixels in a one-to-one correspondence, each blue light emitting source having substantially the blue emission spectrum comprising the blue emission peak at the blue peak wavelength; and an optical film disposed between, and substantially coextensive with, the emission surface and the plurality of blue light emitting sources and comprising a plurality of layers numbering at least 10 in total, each layer having an average thickness less than about 500 nm, wherein for substantially normally incident light and for each of mutually orthogonal first and second polarization states:

each region of the optical film that is disposed between a blue light emitting source and the corresponding blue light emitting pixel transmits at least 70% of the incident light having the blue peak wavelength; and each region of the optical film that is disposed between a blue light emitting source and the corresponding green or red light emitting pixel transmits at least 70% of the incident light for each of the green and red peak wavelengths, and reflects at least 50% of the incident light having the blue peak wavelength.

2. The display of claim 1, wherein for substantially normally incident light and for each of the first and second polarization states:

for each region of the optical film that is disposed between a blue light emitting source and the corresponding blue light emitting pixel, the plurality of layers transmits at least 80% of the incident light having the blue peak wavelength; and for each region of the optical film that is disposed between a blue light emitting source and the corresponding green or red light emitting pixel, the plurality of layers transmits at least 80% of the incident light for each of the green and red peak wavelengths, and reflects at least 80% of the incident light having the blue peak wavelength.

3. The display of claim 1 further comprising a light converting film disposed between the optical film and the plurality of blue light emitting sources and comprising pluralities of green and red light converting regions, such that:

each green light converting region is disposed between a green light emitting pixel and the corresponding blue light emitting source and is configured to convert at least a portion of the blue light emitted by the blue light emitting source to a converted green light and transmit the converted green light toward the green light emitting pixel through the optical film; and each red light converting region is disposed between a red light emitting pixel and the corresponding blue light emitting source and is configured to convert at least a portion of the blue light emitted by the blue light emitting source to a converted red light and transmit the converted red light toward the red light emitting pixel through the optical film.

4. The display of claim 3, wherein the light converting film comprises one or more of phosphor, fluorescent dye, and quantum dots.

5. The display of claim 1, wherein at least some of the layers in the plurality of layers are polymeric.

6. The display of claim 1, wherein at least some of the layers in the plurality of layers are inorganic.

7. The display of claim 1, wherein a maximum birefringence of each layer in the plurality of layers is less than about 0.01 for at least one of the blue, green and red peak wavelengths.

8. A multilayer continuous optical film comprising a plurality of layers numbering at least 20 in total, each of the layers having an average thickness of less than about 500 nm, the multilayer continuous optical film comprising pluralities of at least alternating first and second regions arranged along rows and columns of the first and second regions and configured to be aligned in one-to-one correspondence to a plurality of pixels of a display, such that for substantially normally incident light having a wavelength in a desired wavelength range extending from about 400 nm to about 2000 nm and for each of mutually orthogonal first and second polarization states:

the first regions of the multilayer continuous optical film transmit at least 70% of the incident light having a first wavelength in the desired wavelength range and reflect at least 70% of the incident light having a second wavelength in the desired wavelength range; and the second regions of the multilayer continuous optical film reflect at least 70% of the incident light having the first wavelength and transmit at least 70% of the incident light having the second wavelength, wherein each layer in at least a majority of the plurality of layers extends continuously across each of a length and a width of the multilayer continuous optical film, the length and the width being orthogonal directions that are each orthogonal to a thickness direction of the multilayer continuous optical film.

9. The multilayer continuous optical film of claim 8, wherein the layers in the plurality of layers are polymeric.

10. The multilayer continuous optical film of claim 8, wherein the layers in the plurality of layers are inorganic.

11. The multilayer continuous optical film of claim 8, wherein the plurality of layers comprises alternating polymeric and inorganic layers.

12. The multilayer continuous optical film of claim 8, wherein each layer in the plurality of layers comprises indices of refraction nx and ny along mutually orthogonal in-plane respective x- and y-directions and an index of refraction nz along a thickness direction of the layer orthogonal to the x- and y-directions, a magnitude of a maximum difference between nx, ny and nz less than about 0.01 for at least one of the first and second wavelengths.

13. A display comprising a plurality of blue, green and red light emitting pixels configured to display an image at an emission surface of the display and having respective blue, green and red emission spectra comprising respective blue, green and red emission peaks at respective blue, green and red peak wavelengths, each light emitting pixel comprising:

a blue light emitting source having substantially the blue emission spectrum comprising the blue emission peak at the blue peak wavelength;

a multilayer optical film disposed between the emission surface and the blue light emitting source and comprising a plurality of layers numbering at least 10 in total, each layer having an average thickness less than about 500 nm, such that for substantially normally incident light and for each of mutually orthogonal first and second polarization states:

the plurality of layers in each blue light emitting pixel transmits at least 70% of the incident light having the blue peak wavelength; and the plurality of layers in each of the green and red light emitting pixels reflects at least 70% of the incident light having the blue peak wavelength and transmits at least 70% of the incident light for each of the green and red peak wavelengths; and a circular polarizer disposed between the emission surface and the multilayer optical film, the circular polarizer comprising an absorbing polarizer and a retarder.

14. The display of claim 13, wherein the multilayer optical films in the plurality of light emitting pixels form a continuous optical film comprising each of the plurality of layers of the multilayer optical films, each layer in at least a majority of the layers of the continuous optical film extending continuously across each of a length and a width of the continuous optical film, the length and the width being orthogonal directions that are each orthogonal to a thickness direction of the continuous optical film.

15. The display of claim 13, wherein for each green and red light emitting pixel, the plurality of layers of the multilayer optical film comprises alternating first and second layers stacked along a thickness direction of the multilayer optical film, such that for at least one of the blue, green and red peak wavelengths, a first index of refraction of the first layers is greater than a second index of refraction of the second layers by at least about 0.2.

16. The display of claim 13, wherein the multilayer optical films in the plurality of light emitting pixels form a continuous optical film comprising each of the plurality of layers of the multilayer optical films, wherein each layer of the continuous optical film is a continuous polymeric layer.

17. The multilayer continuous optical film of claim 8, wherein each layer of the plurality of layers extends continuously across each of the length and the width of the multilayer continuous optical film.

18. The display of claim 1, wherein each layer in at least a majority of the plurality of layers of the optical film extends continuously across each of a length and a width of the optical film, the length and the width being orthogonal directions that are each orthogonal to a thickness direction of the optical film.

19. The display of claim 1, wherein each layer of the plurality of layers of the optical film is a continuous polymeric layer.

20. The display of claim 1, further comprising a circular polarizer disposed between the emission surface and the optical film, the circular polarizer comprising an absorbing polarizer and a retarder.

* * * * *